(12) United States Patent
Strehlow et al.

(10) Patent No.: US 11,035,622 B1
(45) Date of Patent: Jun. 15, 2021

(54) THERMAL CONDITIONING ASSEMBLY

(71) Applicant: Minco Products, Inc., Minneapolis, MN (US)

(72) Inventors: Russell H. Strehlow, St. Paul, MN (US); Kyle J. Wagner, Minneapolis, MN (US); Scott A. Dupay, Blaine, MN (US)

(73) Assignee: Minco Products, Inc., Minneapolis, MN (US)

( * ) Notice: Subject to any disclaimer, the term of this patent is extended or adjusted under 35 U.S.C. 154(b) by 0 days.

(21) Appl. No.: 16/894,022

(22) Filed: Jun. 5, 2020

Related U.S. Application Data

(63) Continuation-in-part of application No. 16/036,298, filed on Jul. 16, 2018, which is a continuation-in-part
(Continued)

(51) Int. Cl.
*F28D 15/00* (2006.01)
*F28D 15/04* (2006.01)
(Continued)

(52) U.S. Cl.
CPC ....... *F28D 15/046* (2013.01); *F28D 15/0233* (2013.01); *H05K 7/20336* (2013.01)

(58) Field of Classification Search
CPC ...... F28D 15/02; F28D 15/04; F28D 15/0233; F28D 15/0283
(Continued)

(56) References Cited

U.S. PATENT DOCUMENTS 3,680,189 A    8/1972   Noren
5,216,580 A    6/1993   Davidson et al.
(Continued)

FOREIGN PATENT DOCUMENTS

JP    2001-241870 A    9/2001

OTHER PUBLICATIONS

International Search Report and Written Opinion from PCT/US2015/030119; 9 pages; Blain Copenheaver; dated Aug. 10, 2015.
(Continued)

*Primary Examiner* — Claire E Rojohn, III
(74) *Attorney, Agent, or Firm* — Dicke, Billig & Czaja, PLLC

(57) ABSTRACT

A thermal conditioning assembly includes a casing having a first casing portion, a second casing portion and a partition intermediate the casing portions, peripheries of each of the casing portions and the partition united so as to delimit hermetically sealed first and second casing chambers. The first chamber is characterized by the first casing portion and a first surface of the partition and includes a phase change media and wicking structure, heat spreading from a heat source adjacent thereto thusly effectuated. The second chamber, characterized by the second casing portion and a second surface of the partition, dissipates heat from the first chamber. Segments of the second casing portion and the partition are selectively united so as to form one or more baffles which delimit coolant channels. The second chamber includes first and second coolant connectors for coolant ingress and egress in furtherance of circulating coolant through the second chamber via said coolant channels.

33 Claims, 13 Drawing Sheets

Related U.S. Application Data of application No. 15/614,882, filed on Jun. 6, 2017, now Pat. No. 10,036,599, which is a continuation-in-part of application No. 15/029,421, filed as application No. PCT/US2015/030119 on May 11, 2015, now Pat. No. 9,671,174.

(60) Provisional application No. 61/991,008, filed on May 9, 2014.

(51) Int. Cl.
  *F28D 15/02* (2006.01)
  *H05K 7/20* (2006.01)

(58) Field of Classification Search
  USPC .... 165/104.26, 80.4, 104.19, 104.21, 104.33
  See application file for complete search history.

(56) References Cited

U.S. PATENT DOCUMENTS

| | | | |
|---|---|---|---|
| 6,446,706 B1* | 9/2002 | Rosenfeld | F28D 15/0241 165/104.26 |
| 6,665,180 B2* | 12/2003 | Lehman | G06F 1/20 165/104.33 |
| 7,278,469 B2* | 10/2007 | Sasaki | F28D 15/0241 165/104.26 |
| 7,843,695 B2* | 11/2010 | Yang | H01L 23/427 361/702 |
| 7,995,344 B2 | 8/2011 | Dando, III et al. | |
| 8,074,706 B2* | 12/2011 | Su | F28D 15/046 165/104.26 |
| 8,335,083 B2 | 12/2012 | Yang et al. | |
| 8,997,839 B2* | 4/2015 | Yang | F28D 15/046 165/104.26 |
| 9,021,698 B2* | 5/2015 | Yang | F28D 15/0233 29/890.032 |
| 2002/0148596 A1 | 10/2002 | Werninger | |
| 2003/0159806 A1 | 8/2003 | Sehmbey et al. | |
| 2003/0210527 A1 | 11/2003 | Saita | |
| 2006/0124280 A1* | 6/2006 | Lee | H01L 23/467 165/104.26 |
| 2006/0131001 A1 | 6/2006 | Okamoto | |
| 2008/0210407 A1* | 9/2008 | Kim | F28D 15/046 165/104.26 |
| 2009/0211735 A1 | 8/2009 | Stenkamp et al. | |
| 2010/0186931 A1 | 7/2010 | Obara et al. | |
| 2010/0294461 A1* | 11/2010 | Weaver, Jr. | H01L 23/427 165/80.2 |
| 2011/0017431 A1* | 1/2011 | Yang | F28D 15/04 165/104.26 |
| 2011/0048672 A1* | 3/2011 | Martin | F28F 3/12 165/46 |
| 2011/0108245 A1 | 5/2011 | Tan et al. | |
| 2011/0120674 A1* | 5/2011 | MacDonald | F28D 15/04 165/104.26 |
| 2011/0186268 A1 | 8/2011 | Yang | |
| 2013/0327504 A1* | 12/2013 | Bozorgi | F28D 15/0233 165/104.26 |

OTHER PUBLICATIONS

International Preliminary Report on Patentablity from PCT/US2015/030119; 8 pages; Agnes Wittmann-Regis; dated Nov. 15, 2016.

\* cited by examiner

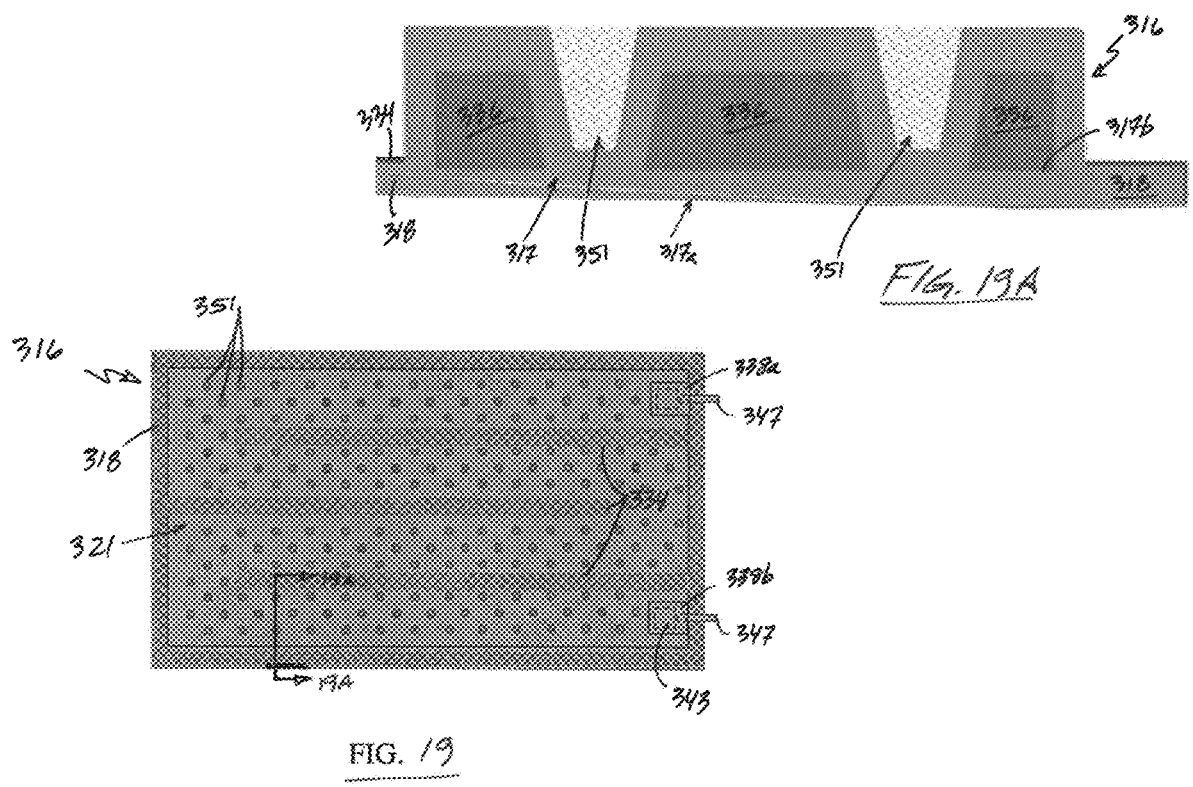

THERMAL CONDITIONING ASSEMBLY

This is a continuation-in-part filed under 35 USC § 111(a) and 37 CFR § 1.53(b) claiming priority under 35 USC § 120 of/to U.S. patent application Ser. No. 16/036,298 filed Jul. 16, 2018 and entitled HEAT DISSIPATING THERMAL GROUND PLANE FIN which is a continuation-in-part of U.S. patent application Ser. No. 15/614,882 filed Jun. 6, 2017 and entitled THERMAL ENERGY STORAGE ASSEMBLY which is a continuation-in-part of U.S. patent application Ser. No. 15/029,421 filed Apr. 14, 2016 and entitled THERMAL GROUND PLANE, the disclosures of which are hereby incorporated by reference in their entireties.

TECHNICAL FIELD

The present disclosure is generally directed to thermal conditioning, more particularly to either or both of heat spreading and heat removal, more particularly still, to one or more of thermal ground planes, thermal ground plane structures, and/or thermal ground plane assemblies on one hand, and fluid cooling devices and/or assemblies on the other hand, and advantageously, an operative functional combination of two phase heat spreading with attendant heat removal via fluid cooling.

BACKGROUND

Power generating electronic and optical devices/systems, as well as energy conversion and storage systems such as fuel cells and the like, have become increasingly compact. So too is the case for data processing electronics such as central and graphic processing units (CPUs & GPUs).

At stake has been and is thermal energy management performance, and thus, the reliability of such devices and systems. Increasingly and currently, it is generally believed that improved thermal energy management is requisite to advance such high performance electronic optical and energy conversion/storage devices and/or systems.

Heat pipes, thermal ground planes and vapor chambers (a/k/a flat heat pipes) are frequently employed for the above noted thermal energy management (i.e., heat spreading). Characteristically, such devices combine principles of both thermal conductivity and phase transition to effectively manage a transfer of heat between two solid interfaces. More particularly, such passive heat transfer devices utilize capillary forces to circulate a working fluid between discrete evaporator and condenser regions of a vacuum tight housing, compartment, shell or vessel.

With regard to such devices, a working fluid occupies a vapor chamber having evaporating and condensing portions. In heat spreading applications, heat enters at a select surface location (i.e., area) and exits across the rest of the surfaces. In heat transport applications, a discrete condenser (e.g., a water cooled block) aids heat transport. The evaporating surface is intended to engage/contact a heat source to absorb the heat of the heat source, thereby heating and evaporating the working fluid in the vapor chamber. When the vapor is brought into contact with a "cold" surface (i.e., the condensing surface), the vapor condenses into liquid to release the latent heat of the working fluid. With the phase change between vapor and liquid of the working fluid, the heat of the heat source can be conducted to the condensing surface.

Heat pipes are generally inexpensive, reliable, and long lived, thus they are in wide use. Moreover, they provide effective heat removal over long distances and can be effective for applications characterized by high g-forces, shock, vibration, and freeze/thaw. Further still, their use enables smaller and more compact arrangements of electronics as is characteristic of hand held devices and avionics. Present technical efforts include those directed to flexible and conformal thermal grounds planes, more particularly, to ease of manufacture and reliability thereof.

Rosenfeld et al. (U.S. Pat. No. 6,446,706), and later Kim et al. (U.S. Pub. No. 2008/0210407 A1) citing same, both incorporated herein by reference in their entireties, generally express concerns relating to the exacerbated tensions of maintaining uniform lamina contacts in furtherance of predictable, repeatable and reliable heat transfer, and establishing suitable capillary force/wicking to facilitate phase change of a working fluid, in the context of thin, flat panel type heat transfer devices. As to the former, each outer heat pipe wall of the purportedly especially flexible heat pipe is characterized by a plurality of lamina, among others, two/dual metal foil layers intended to function as barriers to material ingress/egress. As to the later, in furtherance of an aim of ensuring high thermal conductivity at a low cost, a panel type heat transfer device characterized by one or more aggregated hydrophilllic fiber wick structures and a directional coolant passage is provided. Be that as it may, manufacturing ease for such devices has remained elusive, with reliability wanting.

Issues of low production yield, low vapor-liquid circulation efficiency, and poor internal supporting strength remain as indicated by Yang et al. (U.S. Pat. No. 8,997,839) and Yang (U.S. Pat. No. 9,021,698), each incorporated herein by reference in their entireties. The former teaching provides a thin sheet element characterized by intersectingly extending sections which define element openings, and bosses fixedly located in select openings thereof, the bosses and thin sheet member being disposed in a receiving space of a pipe body at the same time. The latter teaching provides a flat plate heat pipe characterized by only two soldered sealing joints (i.e., the pipe is flattened and the two free ends sealed) and a sintered supporting layer which functions to avoid plate deformation while apertures thereof permit passage of a phase-change media there through and there across.

Beyond the aforementioned developments and perceived shortcomings, capillary wick structures have deservingly been a focal point for thermal ground plane advancement. With reliance upon material science advances, improved thermal conductivity and coefficient of thermal expansion matching have been generally realized in and for capillary wick structures, with work in this area ongoing. Conventional metal powder based wicking structures (e.g., sintered copper) have generally been succeeded, for instance and without limitation, by those characterized by copper foam, copper micro and nano structures (and hybrids thereof), with and without a hydrophilic coating (e.g., an atomic layer deposited (ALD) film), diamond-copper composites, titanium and titania micro and nano structures, and carbon micro and nano structures.

Be that as it may, it is well known and appreciated that a hermetic seal of the thermal ground plane structure is considered critical. Generally known and practiced techniques or methods include, for example, solder bonding, polymer bonding, vacuum brazing, and electron beam welding. Moreover, in addition to a combined bonding approach such as one characterized by a fluorinated ethylene propylene (FEP), e.g., Teflon®, bond with a soldered perimeter or periphery, metal plating over an FEP bonded structure or element, as by ALD, is likewise known and practiced.

While a variety of sealing techniques are known, it is believed advantageous and desirable to overcome known shortcomings. For instance, polymer bonded device peripheries are known to be gas permeable and of suspect reliability for the long haul, with solder bonded device peripheries, by their nature, introducing a potential deleterious solder alloy and/or solder flux contamination interior of the seal (i.e., reacting with the working medium within the chamber), with such union providing/imparting no mechanical strength. Moreover, metal plating over a bonded device periphery to form or fortify the hermetic seal may not be feasible, and contrariwise, it likewise introduces a potential deleterious plating fluid contamination interior of the seal (i.e., reacting with the working medium within the chamber). Finally, while more reliable hermetic seals are achievable, the relative high cost prevents their ubiquitous application.

While heat spreading is a key element of thermal management, e.g., heat spreaders, extruded heat sinks, passive two-phase heat transfer device as heretofore described, advantageous thermal management includes effective dissipation of the transferred/increased heat. Devices to effectively receive and spread heat are commonly combined with heat dissipating means.

For instance, heretofore known devices are adapted to include fins/blades which extend from a thermal contact surface of the thermal management device (e.g., heat spreader). Notionally, the heat transfer device is intermediate the heat source (e.g., electronic/avionic equipment or component) and cooling fins. The cooling fins in these devices generally comprise thin copper or aluminum plates, and increasingly, carbon or carbon composite plates. The heat spreading in these fins/plates is inhibited by their small cross-sectional area and their thermal conductivity properties. Moreover, existing high performance heat-sink assemblies are factory assembled and do not lend themselves to any alteration should a user desire to increase the heat dissipation capacity of the device. Further still, with increased heat generating components, e.g., application specific integrated circuits (ASICs), and inherent space constraints of smaller, minimal "packaging" for the component, e.g., spaced constrained logic cards, heat dissipation via air cooling in the available space is problematic.

In addition to the heretofore cited thermal management devices, devices characterized by phase change material (PCM) are likewise known and generally valued for their energy absorption, heat storage, and/or temperature dampening. PCMs, which are characterized by a high heat of fusion, are capable of storing and releasing large amounts of energy. Heat is absorbed or released when the material changes from solid to liquid and vice versa, with PCMs thusly classified as latent heat storage (LHS) units. While latent heat storage can be achieved through solid→liquid, solid→gas and liquid→gas phase changes, only solid→liquid and liquid→solid phase changes are practical for PCMs. With numerous electronic devices, especially phones, hand helds, tablets, etc. operating at fluctuating power levels (i.e., periods of low and high power demands), the attenuation or buffering of variable thermal demands/loads via a heat sink (e.g., a PCM heat sink) is believed desirable and advantageous owing to a promise of improved electronic device performance and reliability. That said, PCMs have their limitations and/or shortcomings, most notable, heat distribution. While known PCMs have undergone adaptation to improve or enhance energy absorption, heat storage and/or heat dissipation characteristics for passive thermal control (see e.g., Outlast® LHS heat spreaders from Outlast Technologies LLC, Colorado, USA), efforts in this area nonetheless continue.

Notionally, the described PCM in operative combination with a thermal ground plane satisfy a long established two prong thermal management solution, namely, heat spreading and device temperature dampening (i.e., temperature excursion dampening). Current high performance heat-sink assemblies, whether heat pipe or vapor chamber assemblies, are characterized by cooling fins.

In light of the foregoing, there thus remains a need to provide a low cost, long lived thermal ground plane characterized by a highly reliable hermetic seal. Moreover, there thus remains a need to provide a low cost, long lived thermal ground plane having structural chamber members formable within a device periphery characterized by a highly reliable unions of select opposing chamber portions. Further still, it is believed desirable and advantageous to provide an elegant, low cost process for fabricating high reliability thermal ground planes. Yet further still, it is believed desirable and advantageous to improve PCM performance via an adaptation wherein an improved thermal ground plane is operatively combined with a PCM, adapted or otherwise. Moreover, it is believed desirable and advantageous to provide a heat dissipating fin characterized by a specially configured thermal ground plane, preferably in the form of stackable, highly thermally conductive heat dissipating fins. Finally, it is believed desirable and advantageous to provide a low profile fluid cooling device alone or in operative combination with a thermal ground plane, more particularly, a two-phase heat spreader with integral fluid cooling for heat removal.

SUMMARY OF THE INVENTION

A thermal ground plane is generally provided. The device includes a casing characterized by a first casing portion and a second casing portion, the first casing portion united with the second case portion via an ultrasonic weldment so as to delimit a hermetically sealed casing chamber characterized by evaporating and condensing portions, segments or sections. A phase-change media resides within the casing chamber, along with a wicking structure and a spacing or vapor element. The wicking structure, which among other things aids phase-change of the phase change media, is adjacent the first casing portion of the casing. The spacing element, which among other things likewise aids phase-change of the phase change media, is intermediate the wicking structure and the second casing portion.

Advantageously, as circumstances warrant, opposing casing portions are selectively united via an ultrasonic weldment in furtherance of forming tensioning elements within the casing chamber. The tensioning elements comprise at least portions of each of the first casing portion and the second casing portion, however, the tensioning elements may alternately comprise portions of each of the first casing portion, the wicking structure, the spacing element, and the second casing portion.

Further still, the subject thermal ground plane may further include a metal/metal alloy coating, namely, a metal coating overlaying the ultrasonic weldments of the device. Advantageously, the metal coating may be a soldered coating or a brazed coating.

Yet further, a thermal ground plane precursor is provided. The precursor is generally characterized by a working envelope having a first envelope portion and a second envelope portion. The first envelope portion is united with the second envelope portion via a primary ultrasonic weldment so as to delimit an envelope chamber. The first envelope portion and the second envelope portion are further united via a secondary ultrasonic weldment partially traversing the working envelope so as to substantially delimit first and second envelope compartments, the first envelope compartment characterized by a phase-change media filling port. A phase-change media resides within the working envelope. A wicking structure resides within the second envelope compartment adjacent a portion of the first envelope element, and a spacing element likewise resides within the second envelope compartment intermediate the wicking structure and a portion of the second envelope portion. Subsequent to introducing the phase change media to the working envelope, the secondary ultrasonic weldment is adapted so as to fully traverse and bifurcate the working envelope and thereby delimit a casing, the casing being commensurate with the first envelope compartment, the first envelope compartment thereafter removable in furtherance of delimiting a thermal ground plane characterized by a chargeportless casing.

Yet further still, a thermal energy storage assembly characterized by a housing having first and second chambers characterized by first (e.g., solid/liquid) and second (e.g., liquid/vapor) phase-change media, respectively, is generally provided. The housing includes first and second housing portions and a partition structure, the housing portions and the partition structure united about their peripheries via an ultrasonic weldment so as to delimit the housing chambers. The second housing chamber includes condenser and evaporator chamber portions or segments. The partition structure and the second housing portion are selectively united via ultrasonic weldment in furtherance of forming tensioning elements within same. A wicking structure and spacing element reside within the second housing chamber to aid phase-change of the second phase change media.

A heat dissipating fin, singularly or in multiples, for operative union with a device requiring thermal management is further provided. The fin includes a casing characterized by a first casing portion and a second casing portion. The first casing portion is united with the second case portion so as to delimit a hermetically sealed casing chamber. A casing portion of the first or second casing portions is characterized by a thermally conductive spacer. A surface of the first casing portion comprises a casing condenser section, a surface of the second casing portion comprises a casing evaporator section. A phase-change media resides within the casing chamber and a wicking structure, to aid phase-change of the phase change media, resides within the casing chamber adjacent the second casing portion of the casing.

Finally, a contemplated thermal conditioning assembly includes a casing having a first casing portion, a second casing portion and a partition intermediate the casing portions, peripheries of each of the casing portions and the partition united so as to delimit hermetically sealed first and second casing chambers. The first chamber is characterized by the first casing portion and a first surface of the partition and includes a phase change media and wicking structure, heat spreading from a heat source adjacent thereto thusly effectuated. The second chamber, characterized by the second casing portion and a second surface of the partition, dissipates heat from the first chamber. Segments of the second casing portion and the partition are selectively united so as to form one or more baffles which delimit coolant channels. The second chamber includes first and second coolant connectors for coolant ingress and egress in furtherance of circulating coolant through the second chamber via said coolant channels. In an alternate form, a thermal conditioning assembly comprises a stand-alone heat dissipating device. More specific features and advantages obtained in view of those features will become apparent with reference to the drawing figures and DETAILED DESCRIPTION OF THE INVENTION.

BRIEF DESCRIPTION OF THE DRAWINGS

The assembly, subassemblies, apparatus, structures and/or elements disclosed directly or implicitly herein may be embodied in other specific forms without departing from the spirit or general characteristics thereof, some of which forms have been indicated. Thus, the features described and depicted herein/herewith are to be considered in all respects illustrative and not restrictive. Moreover, in-as-much-as structures have been assigned select unique reference characters through the subsequent written description, and which correlate to at least one drawing of the instant drawings, the identification of all depicted structures in any given drawing via the inclusion of reference characters has been superseded for the sake of clarity. The drawings are described as follows:

FIG. 19 depicts, schematic plan top view, the heat dissipating component of the thermal conditioning assembly of FIG. 16 wherein structural elements of the heat dissipating component thereof are shown;

FIG. 19A depicts section 19A-19A of FIG. 19;

DETAILED DESCRIPTION OF THE INVENTION

As a preliminary matter, the instant disclosure generally sets forth illustrative, non-limiting thermal ground planes characterized by casing having a hermetic ultrasonic welded seal. Moreover, internal structural members or elements (e.g., tension members or "posts") of or for such device are delimited by a select ultrasonic welded unions of device portions. Further still, in addition to such devices, a precursor device is disclosed, with attendant methods of fabricating the contemplated device/device precursor likewise disclosed. Yet further still, an especially advantageous, non-limiting thermal energy storage assembly characterized by the contemplated thermal ground plane assembly is disclosed. Finally, an especially advantageous, non-limiting heat dissipating fin for operative union with a device requiring thermal management is provided.

Figure 1:
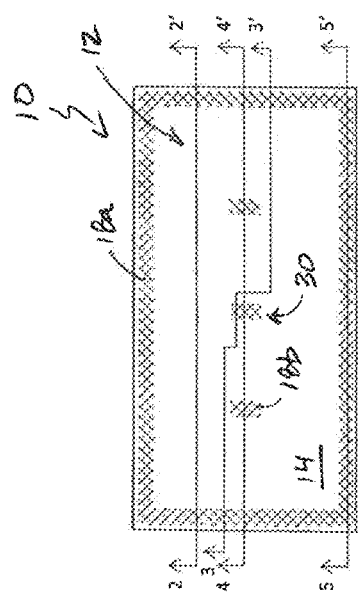
FIG. 1 depicts, schematic plan, a representative, non-limiting thermal ground plane characterized by ultrasonically welded unions delimiting both a hermetically sealed device periphery and internal tension members.
Figure 5:
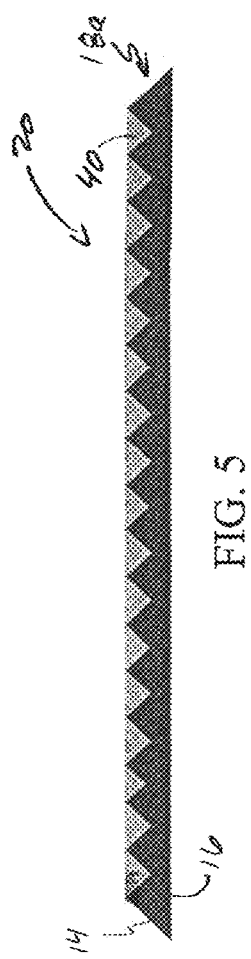
FIG. 5 is a sectional view about line 5-5' of the thermal ground plane of FIG. 1 schematically indicating ultrasonically united casing portions, namely, a hermetically sealed and fortified chamber periphery.
Figure 6:
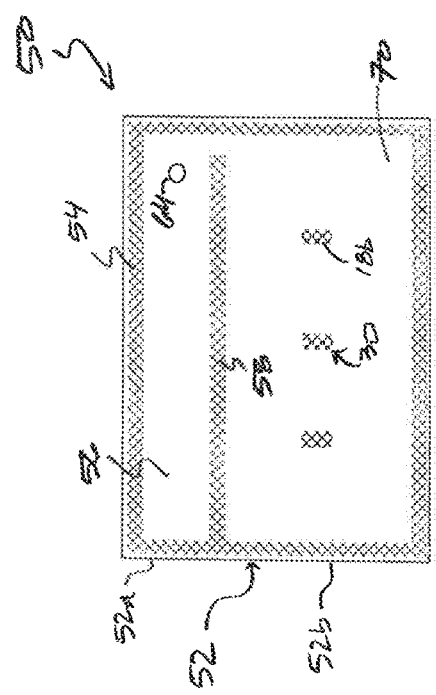
FIG. 6 depicts, schematic plan, a representative, non-limiting precursor of the thermal ground plane of FIG. 1.
Figure 7:
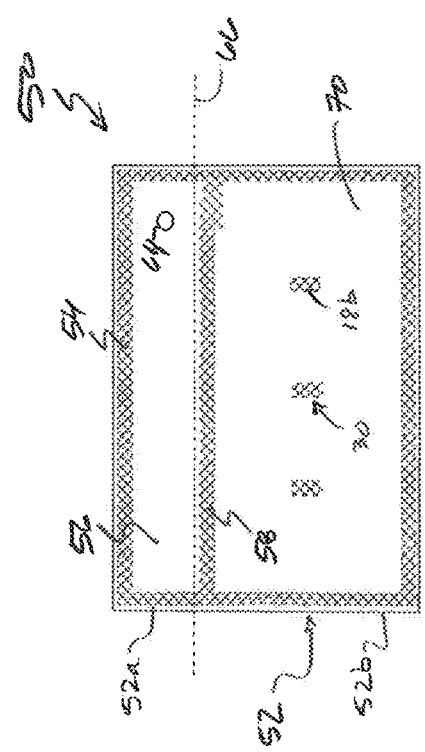
FIG. 7 depicts, schematic plan, adaptations relative to the FIG. 6 precursor.

By way of overview, a thermal ground plane, plan view, is schematically illustrated in FIG. 1, and again as part of a thermal ground plane assembly (FIG. 8), with a thermal ground plane precursor and adaptation thereof depicted in FIGS. 6 & 7 respectively. First, second, third and fourth representative, non-limiting sections of the thermal ground plane of FIG. 1 are provided in FIGS. 2-5; the first emphasizing a device casing and elements thereof; the second emphasizing an advantageous tensioning element characterized by direct union of opposed casing portions; the third emphasizing a further advantageous, alternate tensioning element characterized by a union of opposed device portions; and, the fourth emphasizing an advantageous peripheral union of opposed device casing members. A contemplated heat dissipating fin for operative union with a device requiring thermal management is generally depicted, FIGS. 9 & 10, an alternate embodiment depicted FIG. 12, with contemplated representative fin stacks depicted FIGS. 11 & 13, with alternate spacer configurations for stacked fins illustrated FIGS. 14 & 15. Finally, a heat conditioning assembly characterized by an operative combination of thermal ground plane and heat dissipating elements is generally depicted FIGS. 16 & 17, advantageous, non-limiting features for the assembly, or a derivable stand-alone heat dissipating device, are fairly depicted in FIGS. 18-21.

While the balance of the instant disclosure speaks to flexible thermal ground planes (FTGPs), and assemblies characterized by same, Applicant's subject matter is not intended to be so limited. Moreover, while advantageous and even preferred features are disclosed, in addition to particulars for the contemplated thermal ground plane and its precursor (i.e., specifications for the device and its components), it is to be understood that such disclosure is illustrative and not intending to be limiting, with departures as to same contemplated.

Figure 2:
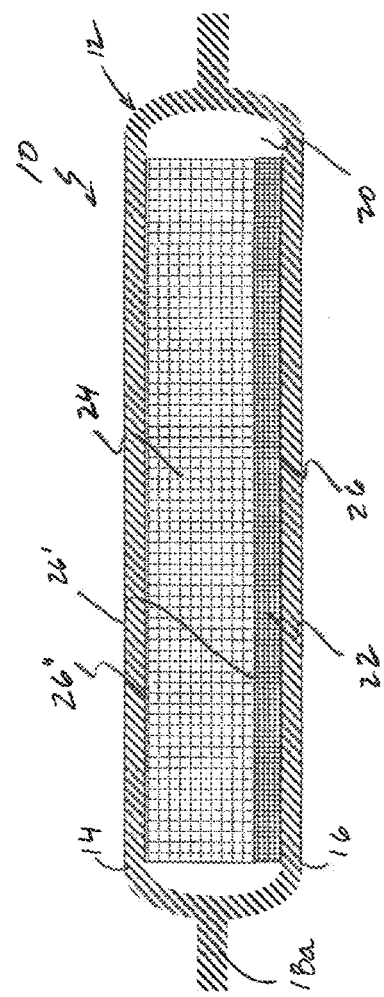
FIG. 2 is a sectional view about line 2-2' of the thermal ground plane of FIG. 1.

With initial reference to FIGS. 1 & 2, there is generally shown, in two views, a thermal ground plane 10. The device generally includes a casing 12 characterized by a first casing portion 14 and a second casing portion 16 (FIG. 2), the first casing portion united with the second case portion via an ultrasonic weldment 18, i.e., a peripheral ultrasonic weldment 18a, so as to delimit a hermetically sealed casing chamber 20 (FIG. 2), a phase-change media, a/k/a, a working fluid, generally residing therein. The device further and generally includes a wicking structure 22 and a spacing or vapor element 24, each of which resides within casing chamber 20 (FIG. 2). Wicking structure 22 is adjacent second casing portion 16 of casing 12, more particularly, an interior surface of the second casing portion (i.e., a casing evaporator segment, portion, or region). More particularly, and advantageously, a bonded interface for, between and among the wicking structure and the second casing portion is provided, for example and without limitation, via a diffusion bonded interface 26. Spacing element 24 is intermediate wicking structure 22 and first casing portion 14, more particularly, an interior surface of the first casing portion (i.e., a casing condenser segment, portion, or region). Advantageously, but hardly exclusively, diffusion bonding of all lamina of the casing, i.e., each lamina-lamina interface, is contemplated, e.g., a diffusion bonded interface 26' is contemplated for, between and among wick structure 22 and spacer element 24, and a diffusion bonded interface 26" is contemplated for, between and among spacer element 24 and first casing portion 14, with both thermal and mechanical advantage realized. As to the latter, via a structurally unified chamber interior via the bonded lamina interfaces, this approach is believed a functional alternative to the tensioning elements contemplated in select applications, however, a device characterized by both features is believed desirable.

Figure 3:
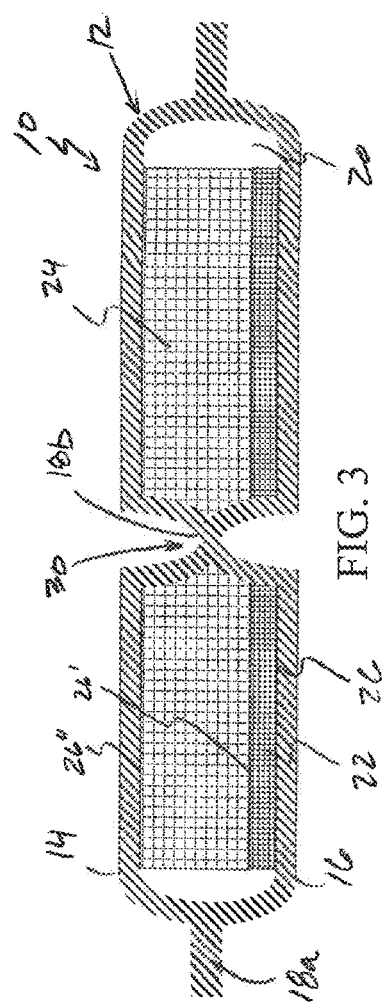
FIG. 3 is a sectional view about line 3-3' of the thermal ground plane of FIG. 1 indicating a tension member section.
Figure 4:
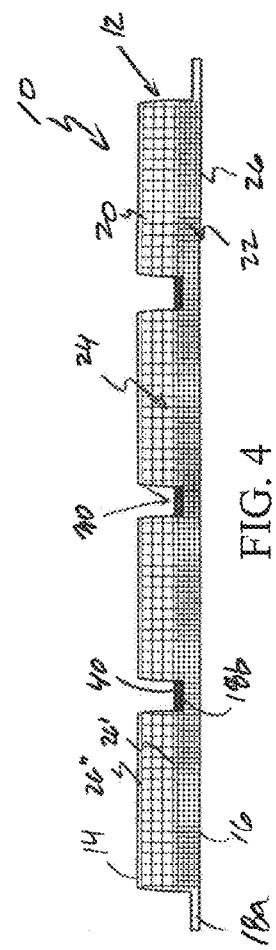
FIG. 4 is an alternate sectional view, about line 4-4', of the thermal ground plane of FIG. 1 schematically indicating an alternate tension member section.

With reference now to FIGS. 1, 3 & 4, tension elements 30 are advantageously and variably contemplated as shown. Notionally, such elements function to maintain the structural integrity of the casing, more particularly, the structural integrity of the casing chamber, the location and number of such elements being part-and-parcel of a given application and its aims. Advantageously, opposing casing portions are selectively united via an ultrasonic weldment, i.e., an interior ultrasonic weldment 18b, in furtherance of forming tensioning elements 30 within casing chamber 20.

In connection to FIG. 3, opposing casing portions 14, 16 are selectively united via ultrasonic weldment 18b in furtherance of forming tensioning elements 30 within casing chamber 20, each tensioning element solely characterized by portions of each of first casing portion 14 and second casing portion 16. In furtherance of manufacturing ease, more particularly, registration and retention of device lamina during operations in furtherance of chamber formation, internal lamina may be adapted to include a select arrangement or configuration of apertures within their peripheries, these locals being subject of interior weldment operations yielding the tensioning elements depicted.

In connection to FIG. 4, and in contradistinction to FIG. 3, opposing casing portions may be selectively united via an ultrasonic weldment 18b in furtherance of forming tensioning elements 30 within casing chamber 20, each tensioning element characterized by portions of each of first casing portion 14, wicking structure 22, spacing element 24, and second casing portion 16. Via a single step, all weldments may be made, and in a less than atmospheric environment, the weldments possess sufficient strength to maintain casing integrity, and critically sufficient cooperative engagement of the casing elements, e.g., the wicking structure and its adjacent casing portion, in furtherance of effective heat transfer.

The weldment is ultrasonically applied. Via a localized application of high-frequency ultrasonic acoustic vibrations to a workpiece, e.g., overlaying casing portions or opposed chamber portions, a solid-state weldment is formed or formable. In-as-much as any of a seam weld, an overlapping spot weld, and/or an overlapping line weld is contemplated and believed suitable for the formation of either and/or both of a hermetic casing seal and tension elements, a seam weld is understood to be especially advantageous.

As is best appreciated with reference to either or both of FIGS. 4 & 5, an especially advantageous embodiment of the contemplated thermal ground plane further includes a metal/metal alloy coating 40, more particularly, a coating of same upon ultrasonic weldments 18 of the device. Owing to the weld process, localized deformation of casing material may cause a thinning of the material thickness. Moreover, the geometry of the interior weld interface creates stress risers. Application of the metal/metal alloy coating over the weldments strengthens and rigidizes the areas to reduce applied stresses.

The casing portions of the device casing comprise impermeable lamina. Elemental metal, namely, copper or aluminum, and more particularly, foils thereof are preferred but by no means intended to be limiting. Copper foil is especially advantageous owing to its compatibility with water, a common and desirable phase change media or working fluid. Generally, the impermeable lamina is within a thickness range of about 140 mils, with a 3-5 mil thickness advantageous for copper or aluminum foils owing to a good mix of strength versus weight. In applications where the impermeable lamina would/could create an electrical short in a system where the sought after heat management is to be conducted, the otherwise advantageous lamina may be readily adapted so as to selectively include a dielectric. While, for the sake of optimal heat transfer/conductance, evaporator and condenser portions of the thermal ground plane are to be free of the generally insulative dielectric, applications may warrant a departure from less than ideal circumstances. Conventional dielectric films, conventionally applied to the impermeable lamina are contemplated, with adhesively applied polyimide believed advantageous.

The wicking structure preferably but not necessarily comprises a layered wicking structure. Conventional wicking structures are generally contemplated, e.g., and without limitation, a micro-mesh, a felt, or a sintered material, with copper preferred owing to its ubiquitous acceptance as a neutral element, i.e., it does not contribute to the formation of deleterious non-condensable gases. As to wicking structure thickness, a balancing of performance aims are commonly in play, e.g., thermal objectives versus physical constraints. Cooperative engagement of the wicking structure with the evaporator the device is believed advantageous, a diffusion bonded interface for, between and among the structure and its adjacent casing portion is preferred.

The vapor spacing element may suitably take a variety of forms and comprise one of many well know materials. Be that as it may, a metal mesh, e.g., copper mesh, is preferred owing to its simplicity and its general inertness and compatibility with diffusion bonding in a copper to copper context. In connection to a stack-up for removing heat from a 25 watt heat generating source such as an electronic component, the following working example is provided: 2 mil polyimide, 1 mil acrylic adhesive, 4 mil copper foil, 16 mesh copper with 10 mil diameter wire, three layers of 200 mesh copper with 2.5 mil wire diameter, 4 mil copper foil, 1 mil acrylic adhesive, 2 mil polyimide. Representative non-limiting device applications include component cooling in connection to circuit boards or other high powered electronic arrays or battery pack cooling/heat spreading.

Referring now to FIGS. 6 & 7, an advantageous thermal ground plane precursor 50 is provided. As will be described, and appreciated in connection thereto, the fabrication approach for the contemplated thermal ground plane results in a "chargeportless" casing, i.e., the hermetic ultrasonic periphery weldment delimiting the casing chamber of the device is not adulterated via post manufacture/post manufacture working fluid charging. Needless to say, such approach greatly aids performance reliability and a long lived performance reliability.

The precursor, as shown, is generally characterized by a working envelope having a first envelope portion 56 and a second envelope portion 70. The first envelope portion is united with the second envelope portion via a primary ultrasonic weldment 54 so as to delimit an envelope chamber. The first envelope portion and the second envelope portion are further united via a secondary ultrasonic weldment 58 partially traversing the working envelope so as to substantially delimit first and second envelope compartments, the first envelope compartment characterized by a phase-change media filling port 64 (FIG. 6), with a phase-change media residing within the working envelope.

A wicking structure resides within the second envelope compartment adjacent a portion of the first envelope element, and a spacing element likewise resides within the second envelope compartment intermediate the wicking structure and a portion of the second envelope portion (see e.g., FIG. 2 as to particulars). Subsequent to introducing the phase change media to the working envelope, secondary ultrasonic weldment 58 is adapted so as to fully traverse and bifurcate the working envelope and thereby delimit a casing (FIG. 7), the casing being commensurate with the first envelope compartment. Once so adapted, the first envelope compartment s thereafter removed, as generally indicated via the broken line through the first envelope adjacent the formed casing chamber, in furtherance of delimiting a thermal ground plane characterized by a chargeportless casing.

Benefits accruing from hermetic seals or device unions characterized by ultrasonic weldments or the like are believed numerous. For instance, and without limitation, such approach enables significantly lower cost manufacture of FTGP than vacuum brazing or electron beam welding; introduces little or no non-copper surfaces to the interior chamber of the FTGP (NB: it is a common problem for the long term reliability of heat pipes and vapor chambers for non-standard materials to react with the working medium overtime and form non-condensable gases inside the device, thus negatively impacting its heat transfer performance; copper is the standard for water based heat pipes); provides structural reinforcements for low atmospheric operating environments; enables an efficient means to seal the charging port while actively interfaced with charging apparatus, again with less or no exposure to non-copper surfaces; provides a means to charge the FTGP without leaving any charging port appendage(s) on the final product, and thus, amongst other things, reducing the chance of accidental damage and resulting device failure; and it makes the benefits of a FTGP economically accessible to a wide range of applications.

In addition to the structures depicted and described, several further related items are noteworthy. More particularly, a copper to copper hermetical sealing process for FTGPs, the formation or establishment of copper to copper tension elements or structures, and a metal alloy coating that enhances or fortifies the durability of the formed union or joint.

With regard to the copper to copper hermetic sealing process, preferably, but not necessarily, the process is characterized by a seam weld. Alternatively, overlapping spot or line ultrasonic welds are contemplated. The weld provides both a hermetic seal and necessary mechanical strength. Moreover, a large (i.e., >12"×12") device geometry is enabled via the subject low cost approach in contradistinction to processes currently and commonly used to hermetically seal small diameter tubes, and for hermetically sealing electronic device packages <0.5" in length/width.

With regard to the formation of copper to copper tension members, multiple layers/lamina are contemplated for union in a single step, e.g., all copper materials, through exterior foils and interior wicking and vapor spacing materials. The resulting device provides necessary strength to hold the device/envelope together in less than atmospheric environment.

With regard to the metal alloy coating for enhanced weld joint durability, it is generally understood that the weld process causes localized deformation of copper that can reduce the foil thickness. Post weld solder/braze process strengths these areas. Moreover, with the geometry of the interior weld interface creating stress risers, the post weld solder/braze process rigidizes these areas so as to spread out the stress.

Figure 8:
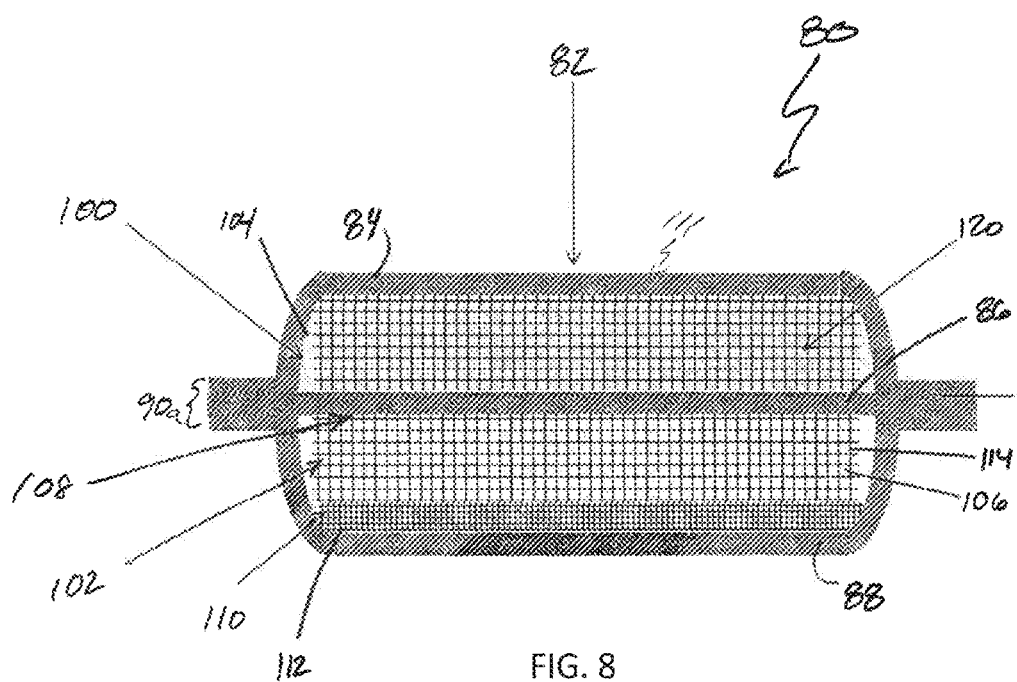
FIG. 8 depicts, sectional view as FIG. 2, a preferred non-limiting thermal energy storage assembly characterized by an operative combination of the thermal ground plane of FIG. 1 with a preferred non-limiting phase change media (PCM) device/assembly.

With reference now to FIG. 8, there is generally depicted, in sectional view, an advantageous, non-limiting thermal energy storage assembly characterized by an operative union of the contemplated thermal ground plane 110 and a phase change material element/assembly 111. That said, it should be understood that the ground up if you will; in lieu of an integrated union of two subassemblies, a single fully integrated structure characterized by two or more chambers is likewise contemplated. Notionally, in the context of the contemplated thermal energy storage assembly, a sealed PCM layer is added to the previously described thermal ground plane, a large amount of energy being absorbed by the phase change material/media without increasing temperature above the material melting point, until the material has completed its phase change (e.g. solid to a liquid).

The assembly 80 of FIG. 8 generally includes a housing 82 characterized by a first housing portion 84, a second housing portion 88, and a partition structure, e.g., an interior wall 86, the first housing portion, the interior wall, and the second housing portion united via an ultrasonic weldment, i.e., a peripheral ultrasonic weldment 90a, so as to delimit hermetically sealed housing chambers 100, 102 about/adjacent partition structure 86. Advantageously, the housing/housing related partition structure material comprises, for example, copper or aluminum, or alloys thereof. The assembly is notably characterized by first 104 and second 106 phase-change media residing with each of the first and second hermetically sealed housing chambers 100, 102, more particularly, and advantageously, solid/liquid and liquid/vapor phase-change media.

In advance of further particulars, some general observations and/or reiterations are worthwhile. Notionally in the context of the illustrated advantageous embodiment, the first chamber functions as a heat sink and takes the form of a phase change material device/assembly, with the second chamber functioning as a heat exchanger and taking the form of a thermal ground plane. Moreover, while a from-the-ground-up fabrication is contemplated for the disclosed assembly, the subassemblies may be suitably united and/or adapted and united to produce an advantageous thermal energy storage assembly.

As should be appreciated via comparison of FIG. 8 with FIG. 2, second housing chamber 102 functions as a thermal ground plane, and advantageously, but not exclusively, is characterized by the functional and/or structural attributes of the heretofore described, shown, or otherwise disclosed thermal ground plane. For example, and without limitation, the second housing chamber includes condenser and evaporator chamber portions, segments or sections. In connection to the depicted FIG. 8 assembly, the condenser segment includes the partition structure, however, alternate thermal ground plane configurations are contemplated, suitable, and even advantageous. The partition structure 86 and second housing portion 102 are selectively united via ultrasonic weldment 90 in furtherance of forming tensioning elements within same (not shown, but see FIG. 3 or FIG. 4). A wicking structure 112 and spacing element 114 reside within second housing chamber 102 to aid phase-change of the second phase change media.

First housing chamber 100 contains first phase-change media 104. Advantageously, but not exclusively, the media comprises an organic compound, more particularly, a paraffin (e.g., C36H74, C32H66, and C30H62), such compounds offering significant life, good chemical compatibility with metals, large latent heat, and a wide operating range. That said, form fits function, with phase-change media selection subject to/of well know factors/parameters, for example, melt temperature/range. Advantageously, owing to relationships for, between, and among assembly elements/components, the first phase-change media can have an otherwise undesirable low thermal conductivity and low viscosity when present in a liquid state.

First housing chamber 100 advantageously includes a thermally conductive element or structure 120, for example, one or more copper screens or punched-and-formed copper foil layers (i.e., a heat spreading, thermally conductive weave). Functionally the structure aids in the transfer of heat from the second housing chamber into the bulk of the first phase-change media, provided structural support/integrity for its housing portion (i.e., first housing portion), and aids in the transfer of heat out of the first phase-change media to the outside surface of the first housing portion. Advantageously, but not necessarily, the thermally conductive element may be as per the spacing or vapor element of the second housing chamber.

Figure 9:
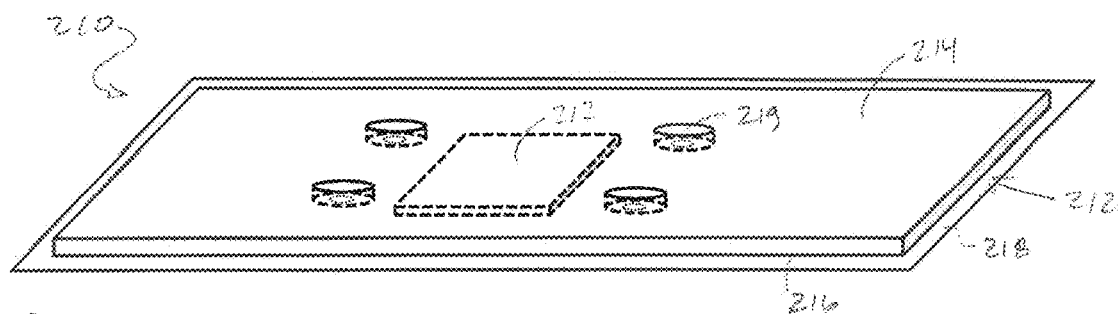
FIG. 9 depicts, perspective view slightly from above, an advantageous, non-limiting heat dissipating thermal ground plane fin.
Figure 10:
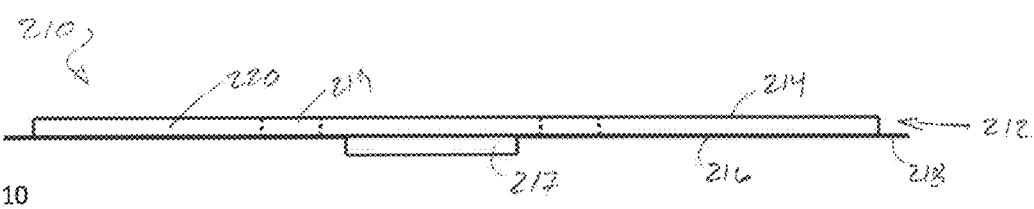
FIG. 10 depicts, side elevation, the FIG. 9 device.
Figure 11:
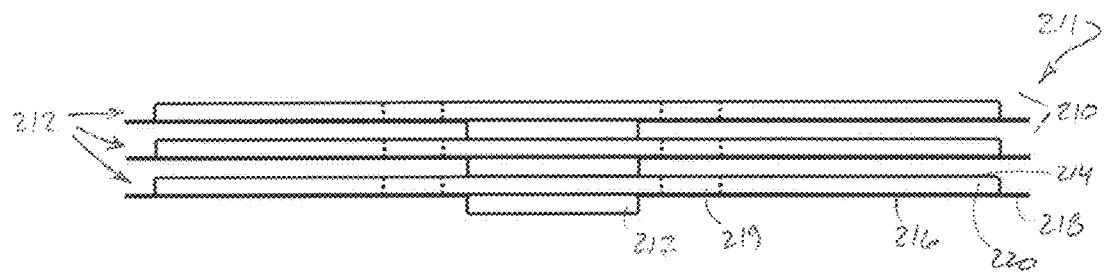
FIG. 11 depicts, side elevation, a plurality of FIG. 9 articles in operative combination, namely a stacked thermal ground plane assembly.

With reference now to FIG. 9 et seq., there is generally depicted in a first, non-limiting embodiment, an advantageous heat dissipating fin 210 (FIGS. 9 & 10), and associated fin stack 211 (FIG. 11). The heat dissipating fin may be used singly or in multiples to dissipate heat, more particularly, the device facilitates the spreading of localized heat over a much larger surface area with an extremely low thermal resistance which enables the spreading of heat to the extremities of the heat-sink assembly where it can be more efficiently dissipated. The device is of a very low profile and, owing to its mounting configuration, is easily configurable to expand the heat spreading/dissipating capacity to meet the need at hand. Moreover, fin stack 211 of FIG. 11 may be readily adapted to include, be equipped with or carry a thermal storage device 219 (FIG. 13), for example and without limitation, a phase change material as earlier described and depicted in relation to the thermal energy storage device of FIG. 8.

Notionally, and as is generally shown, fin 210 includes a casing 212 characterized by a first casing portion 214 and a second casing portion 216. First casing portion 214 is united or joined with the second case portion 216, via weldment 218 or the like, so as to delimit a hermetically sealed casing chamber 220. A surface of first casing portion 214 comprises a casing condenser section, a surface of second casing portion 216 comprising a casing evaporator section.

A casing portion of the first or second casing portions is characterized by a thermally conductive spacer, as shown, second casing portion 216 is characterized by spacer 217. As will be subsequently taken up, the spacer may be an embossed area of its casing portion, or it may be a discrete quantity of material carried by its casing portion.

Casing 212 is advantageously, but not necessarily further characterized by spaced apart through holes or apertures 219 in furtherance of mechanically combining heat dissipating fins so as to form fin stack 211 (FIG. 11). Additional thermal conditioning is readily realized via stacking (e.g., a registered stacking or staggered/cascading stacking as circumstances warrant/provide) over the heat source with application of appropriate clamping force via mechanical fasteners, clamps, etc. with inclusion of a thermal interface material (TIM) such as a gap pad or thermal grease in the stack-up. Moreover, alternative operative union or mounting of multiple devices is contemplated, for instance and with limitation, as by the use of thermally conductive epoxy or the application of solder. Advantageously as shown (FIG. 9 or FIG. 12), but not necessarily, thermally conductive spacer 217 is interposed between opposing sets of spaced apart through holes.

As is otherwise and previously shown and described in connection to the especially advantageous particularized thermal ground plane of FIG. 1 and as is separately and readily appreciated by those of ordinary skill in the art, the heat dissipating fin further and generally includes a phase change media and wicking structure, and may optionally include a vapor element to aid phase-change of the phase of said phase change media. Notionally, the phase change media resides within the casing chamber, with the wicking structure residing therein and adjacent the second casing portion of the casing (i.e., within the evaporator segment of the fin). To the extent present, the vapor element is intermediate the wicking structure and first casing portion of the casing (i.e., with the condenser segment of the fin). While the contemplated heat dissipating fin is not inconsistent with the instant disclosure, it need not be so limited, i.e., the contemplated fin may be and is preferably less particularized than that disclosed.

Figure 12:
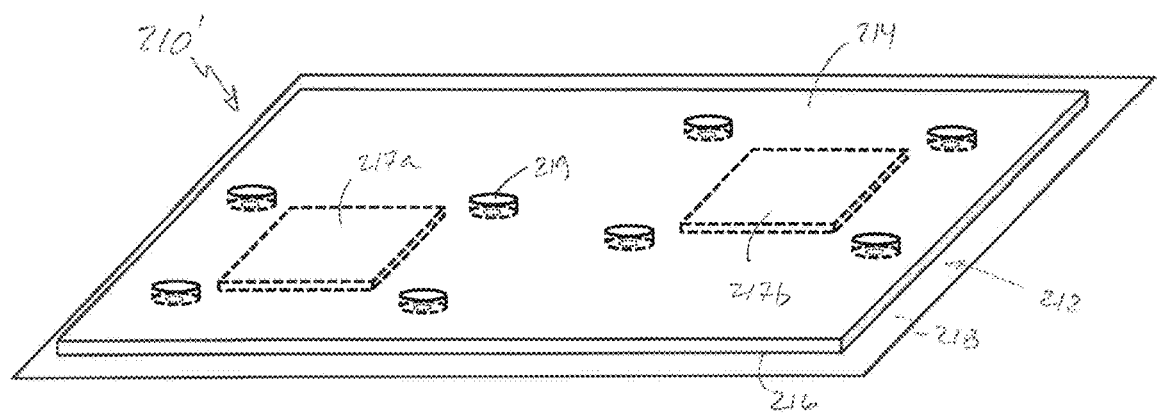
FIG. 12 depicts, perspective view slightly from above, an alternate embodiment of the thermal ground plane of FIG. 9, the article adapted for operative union with multiple heat sources.
Figure 13:
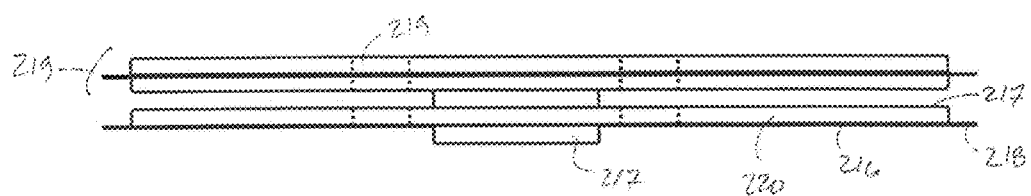
FIG. 13 depicts, side elevation, and alternate thermal ground plane assembly characterized by an operative union of the FIG. 9 article with a thermal storage article, e.g., the PCM of FIG. 8.

With reference now to FIG. 12, there is generally depicted a further, alternate, non-limiting embodiment of a contemplated heat dissipating fin. More particularly, heat dissipating fin 210' is characterized by greater than one spacer, the number generally corresponding to or correlating with multiple heat sources (i.e., two spacers as illustrated (217a, 217b), one for each heat source).

A representative, non-limiting application for a robust thermal energy management assembly comprises laptop computing. A thermal ground plane of about 13×10 inches would be operably combined with one or more heat dissipating fins, more particularly, up to about five fins, each dimensioned as the thermal ground plane and oriented so as to be parallel to the thermal ground plane.

Spacers of the heat dissipating fins separate the casings thereof by a minimum of about 0.1 inch, the spacers advantageously fabricated from high thermally conductive material, e.g., copper, aluminum, aluminum nitride, diamond, etc. The number of spacers per fin advantageously, but not necessarily, equal the number of localized heat sources, e.g., computer processing units (CPU) or Graphic Processor Units (GPUs) being managed. While spacer shape and size are a function of thermal management objectives, spacer thickness generally increases with the area of the thermal ground plane, with a minimum thickness of about 0.1 inches.

Figure 14:
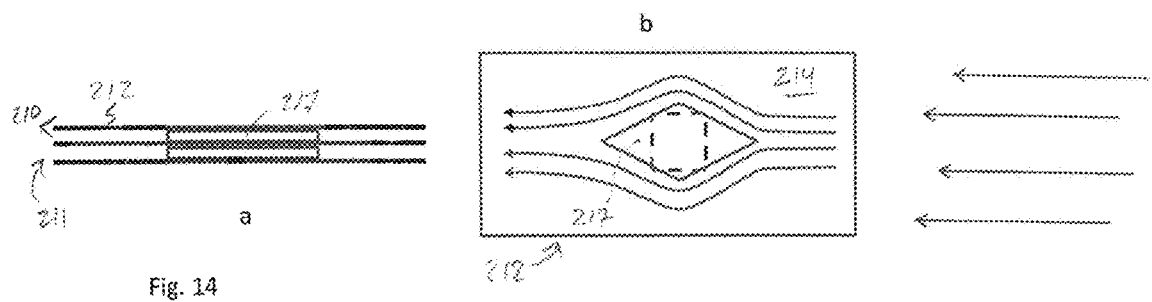
FIGS. 14 & 15 depict, side (left) and plan (right) views, stacked thermal ground plane assemblies, airflow schematically shown/indicated in relation to article spacers, the FIG. 14 assembly being especially advantageous.
Figure 15:
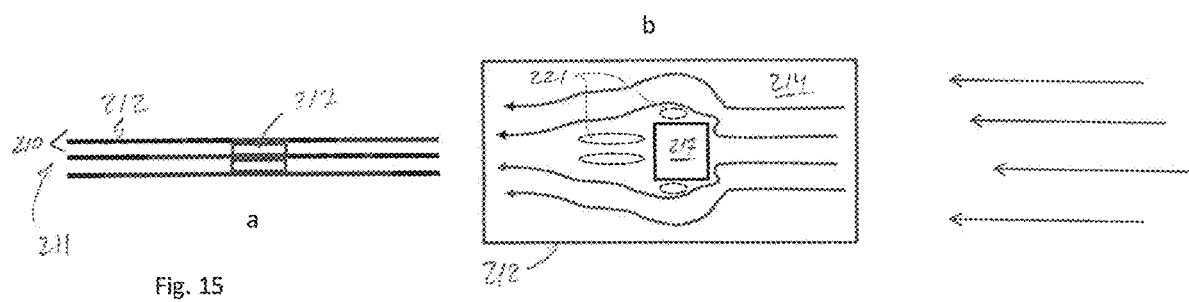

Advantageously, but not exclusively, the thermally conductive spacer is configured as a quadrilateral, more particularly, a rhombus as shown (FIG. 14). Moreover, a long dimension of the thermally conductive spacer is advantageously substantially parallel to a forced air flow direction in furtherance of minimizing the formation of circulation zones 221 (FIG. 15) as forced air movement travels between the casings of the fin stack. It is further contemplated to include ducting to contain the moving air to and about the casings of the fins of the fin stack, and to further adapt the casings of the fins so as to delimit a pattern of through holes to enable the use of spring loaded mounting fasteners or the like, in furtherance of applying localized pressure via a clamping plate to the stack-up of the fins and the spacers at the heat source. Moreover, inclusion of a TIM, in the form of a gap pad or thermal grease or the like is contemplated in the stack-up.

Figure 16:
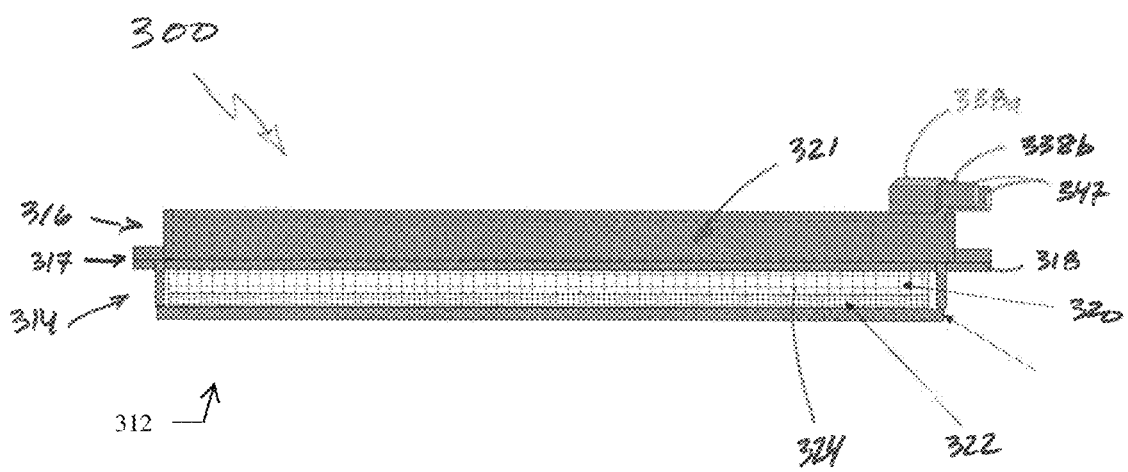
FIG. 16 depicts a preferred, non-limiting thermal conditioning assembly, schematic elevation view, characterized by heat spreading and heat dissipating components.
Figure 17:
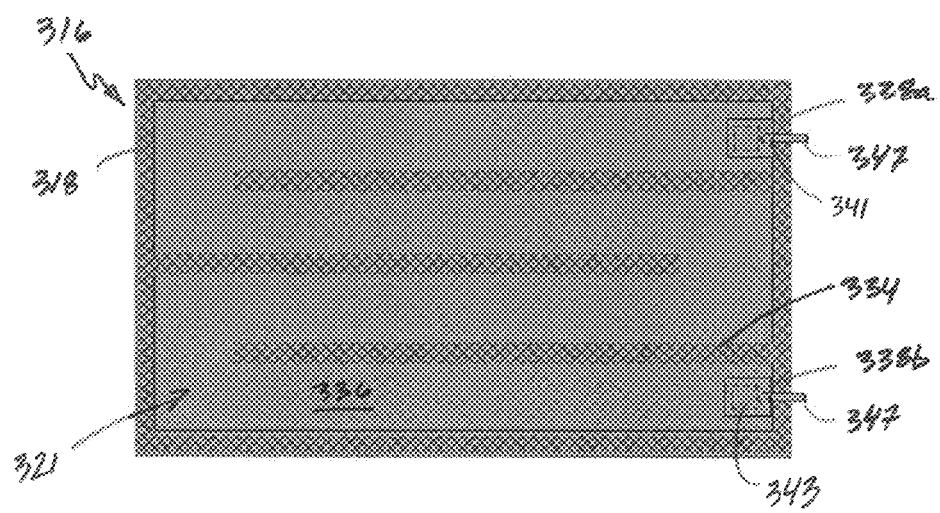
FIG. 17 depicts, schematic plan top view, the heat dissipating component of the thermal conditioning assembly of FIG. 16 wherein features of the heat dissipating component thereof are shown.

Referring now to FIGS. 16 & 17, there is generally depicted a preferred, non-limiting thermal (heat) conditioning assembly 300. The assembly is notionally characterized by heat spreading and heat dissipating elements or components, more particularly, a two phase heat spreader (i.e., thermal ground plane) with integral fluid cooling for heat removal from the heat spreader. Further contemplated features for the assembly, more particularly, the heat dissipating component thereof in the context of the assembly, or in the form of a stand-alone device per se as a heat conditioning assembly, are notionally depicted in each of FIGS. 18-21. Functionally, the heat spreader rapidly moves concentrated heat from a localized heat generating source and spreads it to all spreader surfaces that are at a lower temperature than the temperature of the heat source. In furtherance of extracting and spreading heat from the heat source so as to maintain optimal operation of the heat generating device the heat spreader is operatively paired with the heat dissipating element such that the system temperature is effectively and reliably lowered.

Conditioning assembly 300 is generally and fairly characterized by a casing 312 having a first casing portion 314, a second casing portion 316 and a partition 317 intermediate the casing portions, peripheries of each of the first casing portion, the second casing portion and the partition united so as to delimit hermetically sealed first and second chambers 320, 321. Advantageously, but not necessarily, each of the casing portions and the partition/partition structure comprise, for example, copper or aluminum, or alloys thereof, copper film being believed especially advantageous. Moreover, and in keeping with the disclosure to this point, one or both of the casing portions may suitably include a surface coating or layer, for example, and without limitation, a surface coating or layer comprised of a metal/metal alloy, a polymer, a puncture resistant material, or dielectric material.

Union of the peripheries of each of the casings and the partition are advantageously effectuated, but not necessarily effectuated, via an ultrasonic seam weldment 318, for example and without limitation, a roll seam weldment, an overlapping spot weldment, an overlapping line weldment, etc. Formation of the chambers via a hermetic seal is paramount, the means of creating such hermetic seal readily practiced by those of skill in the art. Finally, while a from-the-ground-up fabrication is contemplated for the depicted assembly the components thereof, in the form of subassemblies (e.g., the heat spreader on one hand, and the heat dissipater on the other hand), may suitably be united and/or adapted and united to produce an advantageous thermal conditioning assembly.

First chamber 320, characterized by first casing portion 314 and a first surface 317a of partition 317, functions to spread heat from a heat source adjacent thereto. A phase change media, advantageously a liquid media, e.g., water, resides within first casing chamber 320 of assembly 300 along with a wicking structure 322, to aid phase change of the phase change media, wicking structure 322 adjacent first casing portion 314 of assembly 300. With regard to the wicking structure, a layered wicking structure is believed advantageous, the structure bondingly united with the first casing portion to ensure uniform thermal conduction between a heat source and the wicking structure. Moreover, a spacing element 324, to aid phase change of the phase change media, resides within first chamber 320 intermediate wicking structure 322 and partition 317, for example, and without limitation, a copper spacing element, and more particularly, a copper mesh spacing element.

As previously described, first chamber 320 may advantageously include tensioning elements to provide for a more robust and effective spreading of heat. The tensioning elements generally comprise selectively united areas of the first casing portion and the partition, and advantageously comprise, selectively united areas of the first casing portion, the wicking structure, and the partition, and as embodiments warrant, selectively united areas of the first casing portion, the wicking structure, the spacer, and the partition Second chamber 321, characterized by second casing portion 316 and a second surface 317b of the partition 317, functions to dissipate heat from the first chamber. Segments of second casing portion 316 and second surface 317b of partition 317 are selectively united, e.g., as by an ultrasonic weldment 318, so as to form one or more baffles 334, the one or more baffles delimiting coolant channels 336. Advantageously, but not necessarily, baffles 336 longitudinally extend within second casing chamber 321 as is generally shown. Second chamber 321 includes first and second coolant connectors 338a, 338b for coolant ingress and egress, respectively, in furtherance of circulating coolant through second chamber 321 via coolant channels 336.

In connection to first chamber 320 of the assembly of FIG. 16, particulars thereof are not inconsistent with those of the illustrative, non-limiting thermal ground plane of FIGS. 1-5 and the description with regard to same. In keeping with the description to this point, an evaporator section (E) for first chamber 320, delimiting the thermal ground plane, notionally corresponds to a portion of an interior surface of first casing portion 314 of casing 312 of assembly 300. A condenser section (C) for first chamber 320 notionally corresponds to a portion of first surface 317a of partition 317 of casing 312 of assembly 300.

In connection to second chamber 321 of the assembly of FIG. 16, more particularly, the heat exchange functionality thereof, coolant travels to and through channels 336 of baffled second chamber 321 of the assembly in furtherance of dissipating heat from first chamber 320 of the assembly. Advantageously, the first and second coolant connectors 338a, 338b have a cross sectional area not less than the cross sectional area of coolant channels 336 (i.e., the cross sectional area associated with the coolant connectors is equal to or great than the cross sectional area of the coolant channels).

Figure 21:
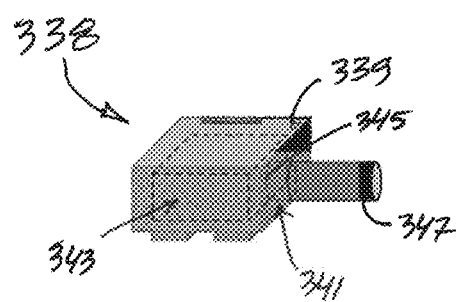
FIG. 21 depicts, perspective side view slightly above, a preferred non-limiting fluid connector of the heat dissipating component of the thermal conditioning assembly of FIG. 16.

With continued reference to FIGS. 16 & 17, and present reference to FIG. 21, a preferred, non-limiting coolant connector 338 is generally shown. Connector 338 includes a housing 339 characterized by a port 341, housing 339 linked to or otherwise in fluid communication with a channel of coolant channels 336 of second chamber 321. Both housing 339 and port 341 include coolant passages, e.g., a cavity 343 in the case of housing 339 and an aperture 345 in the case of port 341. As shown, connector 338 further contemplates an inlet/out in the form of a port tube 347 extending from port aperture 345. Notionally, the cross sectional area of housing cavity 343 and port aperture 345 are substantially equivalent, and more particularly, the cross sectional area of housing cavity 343, port aperture 345 and the coolant channels 336 are substantially equivalent, and preferably, the cross sectional area of housing cavity 343 and port aperture 345 are substantially equivalent, and exceed the cross sectional area of coolant channels 336.

Figures 18, 18A:
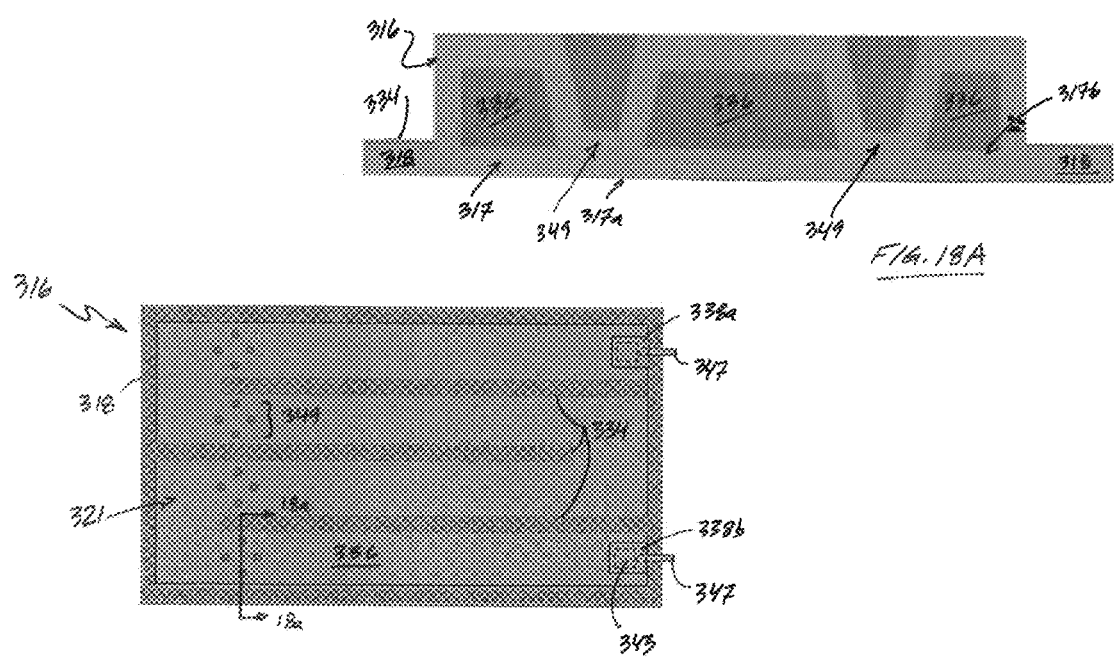
FIG. 18 depicts, schematic plan top view, the heat dissipating component of the thermal conditioning assembly of FIG. 16 wherein coolant flow conditioning elements of the heat dissipating component thereof are shown.
FIG. 18A depicts section 18A-18A of FIG. 18.
Figure 20A:
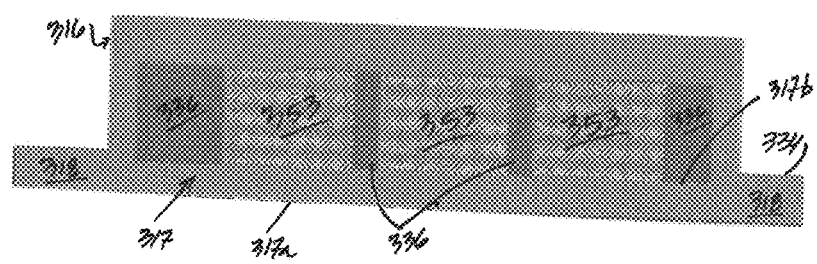
FIG. 20A depicts section 20A-20A of FIG. 20.
Figure 20:
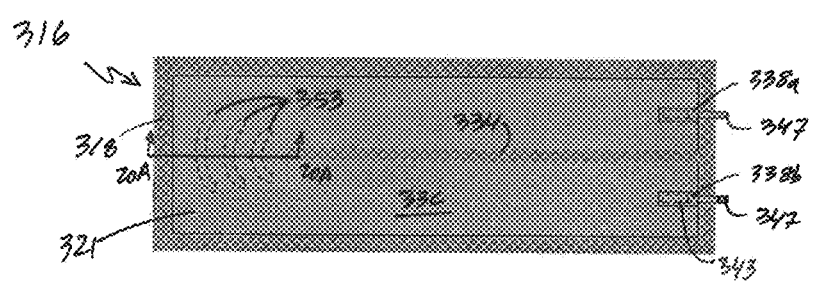
FIG. 20 depicts, schematic plan top view, the heat dissipating component of the heat conditioning assembly of FIG. 16 wherein alternate/further structural elements of the heat dissipating component thereof are shown.

With reference now to FIGS. 18-20, a variety of advantageous, non-limiting features for the heat dissipating element, i.e., the second chamber, of the assembly generally are taken up. More particularly, each of coolant flow conditioning elements and structural elements for the second chamber are taken up, with such elements, particularly their combined presence and extent subject to thermal conditioning objectives and other application considerations.

With reference now to FIGS. 18 & 18A, coolant flow conditioning elements, e.g., coolant path obstructions, are suitably, but not necessarily, provided to enhance heat transfer from to/from the coolant relative to the first chamber (i.e., the heat spreader of the assembly). By way of illustration, cooling channel protuberances or bosses 349 advantageously extend/depend from portions of second casing portion 316, advantageously, but not necessarily, adjacent free ends of baffles 334 of second chamber 321 as shown. Particulars as to the shape, distribution, configuration and/or dimensions for the bosses are predicated upon the assembly application/thermal conditioning objectives.

With reference now to FIGS. 19 & 19A, structural elements, e.g., epoxy filled cooling channel bosses (pillars) 351 as shown, are suitably, but not necessarily, provided to enhance the structural integrity of second chamber 321, or alternately, the stand-alone heat dissipating device as contemplated. By way of illustration, epoxy filled cooling channel bosses 351 advantageously extend/depend from portions of second casing portion 321, a high density distribution for same illustrated. It is to be noted that as the instant structural elements perform coolant flow conditioning, particulars as to the shape, distribution, configuration and/or dimensions for the filled bosses are predicated upon coolant conditioning objectives and/or the assembly application/thermal conditioning objectives.

With reference now to FIGS. 20 & 20A, structural elements, e.g., internal spacers 353 as shown, may be suitably, but not necessarily, provided to enhance the structural integrity of second chamber 321, or alternately, the stand-alone heat dissipating device as contemplated. Via the contemplated spacers, the assembly may be compressed against a localized heat source without compromise (e.g., collapse) of the coolant channel(s); this is likewise the case for the contemplated, stand-alone heat dissipating device. In contradistinction to the pillars, the internal spacers comprise added material in lieu of an adaptation of the second casing portion. Notionally, select fortification of the second chamber via the inclusion of internal spacers occurs in a portion thereof intended to be subjected to clamping tension part-and-parcel of an assembly stack up and/or clamped affixation of the assembly to the localized heat source. While not shown, assembly alignment and mounting brackets are contemplated, such features applicable for the contemplated, stand-alone heat dissipating device.

Since the structures of the assemblies, subassemblies, and/or mechanisms disclosed herein may be embodied in other specific forms without departing from the spirit or general characteristics thereof, some of which forms have been indicated the embodiments described and depicted herein/with are to be considered in all respects illustrative and not restrictive. Moreover, while nominal processing has been described and detailed, and to some degree alternate work pieces and systems, assemblies, etc. with regard thereto referenced, contemplated processes are not so limited. Accordingly, the scope of the subject invention is as defined in the language of the appended claims, and includes not insubstantial equivalents thereto.

What is claimed is:

1. A thermal conditioning assembly comprising:
   a. a casing having a first casing portion, a second casing portion and a partition intermediate the casing portions, peripheries of each of said first casing portion, said second casing portion and said partition united so as to delimit hermetically sealed first and second casing chambers, said first chamber, characterized by said first casing portion and a first surface of said partition, functioning to spread heat from a heat source adjacent thereto, said second chamber, characterized by said second casing portion and a second surface of said partition, functioning to dissipate heat from said first chamber, segments of said second casing portion and said partition selectively united so as to form one or more baffles, the one or more baffles delimiting coolant channels, said second chamber including first and second coolant connectors for coolant ingress and egress in furtherance of circulating coolant through said second chamber via said coolant channels;
   b. a phase change media, said phase change media residing within said first casing chamber; and,
   c. a wicking structure to aid phase change of said phase change media, said wicking structure residing within said first casing chamber adjacent said first casing portion.

2. The thermal conditioning assembly of claim 1 wherein each of said first and second coolant connectors have a cross sectional area equal to or in excess of a cross sectional area of said coolant channels of said second casing chamber.

3. The thermal conditioning assembly of claim 1 wherein said coolant connectors comprise a housing characterized by a port, said housing linked to a channel of coolant channels of said second chamber.

4. The thermal conditioning assembly of claim 3 wherein said housing and said port include coolant passages, cross sectional areas of each passage of said coolant passages being equal.

5. The thermal conditioning assembly of claim 4 wherein coolant passage cross sectional areas are equal to or in excess of a cross sectional area of said coolant channels of said second casing chamber.

6. The thermal conditioning assembly of claim 1 wherein an ultrasonic seam weldment unites select segments of said second casing portion and said partition.

7. The thermal conditioning assembly of claim 1 wherein said one or more baffles longitudinally extend within said second casing chamber.

8. The thermal conditioning assembly of claim 1 wherein said second casing portion includes cooling channel bosses to effectuate coolant flow disruption.

9. The thermal conditioning assembly of claim 1 wherein said second casing portion includes pillars extending into said cooling channels to enhance compression strength.

10. The thermal conditioning assembly of claim 1 wherein said second casing portion includes epoxy filled pillars extending into said cooling channels to enhance compression strength.

11. The thermal conditioning assembly of claim 1 wherein said second casing chamber includes spacers interposed between said second case portion and said partition.

12. The thermal conditioning assembly of claim 1 wherein one or both of said casing portions include a surface coating.

13. The thermal conditioning assembly of claim 1 wherein one or both of said casing portions include a metal surface coating.

14. The thermal conditioning assembly of claim 1 wherein one or both of said casing portions include a polymer surface coating.

15. The thermal conditioning assembly of claim 1 wherein one or both of said casing portions include a puncture resistance surface coating.

16. The thermal conditioning assembly of claim 1 wherein one or both of said casing portions include a dielectric surface coating.

17. The thermal conditioning assembly of claim 1 further comprising a spacing element to aid phase change of said phase change media, said spacing element residing within said first chamber intermediate said wicking structure and said partition.

18. The thermal conditioning assembly of claim 1 further comprising a copper spacing element to aid phase change of said phase change media, said copper spacing element residing within said first chamber intermediate said wicking structure and said partition.

19. The thermal conditioning assembly of claim 1 further comprising a copper mesh spacing element to aid phase change of said phase change media, said copper mesh spacing element residing within said first chamber intermediate said wicking structure and said partition.

20. The thermal conditioning assembly of claim 1 wherein said wicking structure comprises a layered wicking structure.

21. The thermal conditioning assembly of claim 1 wherein said wicking structure is bondingly united with said first casing portion to ensure uniform thermal conduction between a heat source and said wicking structure.

22. The thermal conditioning assembly of claim 1 wherein an ultrasonic seam weldment unites the peripheries of each of said first casing portion, said second casing portion, and said partition.

23. The thermal conditioning assembly of claim 22 wherein said ultrasonic seam weldment comprises a roll seam weldment.

24. The thermal conditioning assembly of claim 22 wherein said ultrasonic seam weldment comprises an overlapping spot weldment.

25. The thermal conditioning assembly of claim 22 wherein said ultrasonic seam weldment comprises an overlapping line weldment.

26. The thermal conditioning assembly of claim 1 wherein said casing comprises an elemental element.

27. The thermal conditioning assembly of claim 1 wherein said casing comprises copper.

28. The thermal conditioning assembly of claim 1 wherein said casing comprises a copper foil having a thickness within a range of about 1-10 mils.

29. The thermal conditioning assembly of claim 1 wherein said casing comprises aluminum.

30. The thermal conditioning assembly of claim 1 wherein said first casing chamber is characterized by tensioning elements, said tensioning element comprised of selectively united areas of said first casing portion and said partition.

31. The thermal conditioning assembly of claim 1 wherein said first casing chamber is characterized by tensioning elements, said tensioning element comprised of selectively united areas of said first casing portion, said wicking structure, and said partition.

32. The thermal conditioning assembly of claim 1 wherein said first casing chamber is characterized by tensioning elements and wherein the assembly further comprises a spacing element residing within said first chamber intermediate said wicking structure and said partition, said tensioning element comprised of selectively united areas of said first casing portion, said wicking structure, said spacer, and said partition.

33. A thermal conditioning assembly comprising:
  a. a casing having first and second casing portions, peripheries of each of the casing portions united so as to form a hermetically sealed fluid chamber, segments of each of the casing portions selectively united within their peripheries so as to delimit one or more fluid flow baffles which define fluid flow channels, each of said casing portions having a thickness in the range of about 1-10 mils; and,
  b. first and second pressurized fluid connectors for ingress and egress, respectively, of pressurized fluid to and from said fluid chamber, each of the pressurized fluid connectors supported by a casing portion of said first and second casing portions, said pressurized fluid connectors characterized by a housing having a port, said housing operatively linked to a channel of said fluid flow channels for pressurized fluid passage to and through said port.

* * * * *